United States Patent [19]

Doan et al.

[11] Patent Number: 5,376,405
[45] Date of Patent: * Dec. 27, 1994

[54] CHEMICAL VAPOR DEPOSITION TECHNIQUE FOR DEPOSITING TITANIUM SILICIDE ON SEMICONDUCTOR WAFERS

[75] Inventors: Trung T. Doan; Gurtej S. Sandhu, both of Boise, Id.

[73] Assignee: Micron Technology, Inc., Boise, Id.

[*] Notice: The portion of the term of this patent subsequent to Aug. 31, 2010 has been disclaimed.

[21] Appl. No.: 48,655

[22] Filed: Apr. 15, 1993

Related U.S. Application Data

[63] Continuation-in-part of Ser. No. 926,754, Aug. 7, 1992, Pat. No. 5,240,739.

[51] Int. Cl.⁵ .............................................. B05D 3/08
[52] U.S. Cl. ................... 427/126.1; 427/255; 427/255.2; 427/294; 437/225
[58] Field of Search ............. 427/585, 294, 255, 255.2, 427/126.1; 437/225

[56] References Cited

U.S. PATENT DOCUMENTS 4,568,565 2/1986 Gupta et al. .................. 427/53.1

*Primary Examiner*—Bernard Pianalto
*Attorney, Agent, or Firm*—Wells, St. John, Roberts, Gregory & Matkin

[57] ABSTRACT

Disclosed is a chemical vapor deposition (CVD) method of providing a conformal layer of titanium silicide atop a semiconductor wafer within a chemical vapor deposition reactor. Such includes, a) positioning a wafer within the CVD reactor; b) injecting selected quantities of a gaseous titanium halide, or alternately or in addition thereto a gaseous titanium organometallic precursor, a gaseous compound of the formula $Si_nH_{2n+2}$ where "n" is an integer greater than or equal to 2, and a carrier gas to within the reactor; and c) maintaining the reactor at a selected pressure and a selected temperature which are effective for reacting the titanium halide and $Si_nH_{2n+2}$ to deposit a film on the wafer, the film comprising a titanium silicide, the method being void of use of high intensity light during processing.

20 Claims, 1 Drawing Sheet

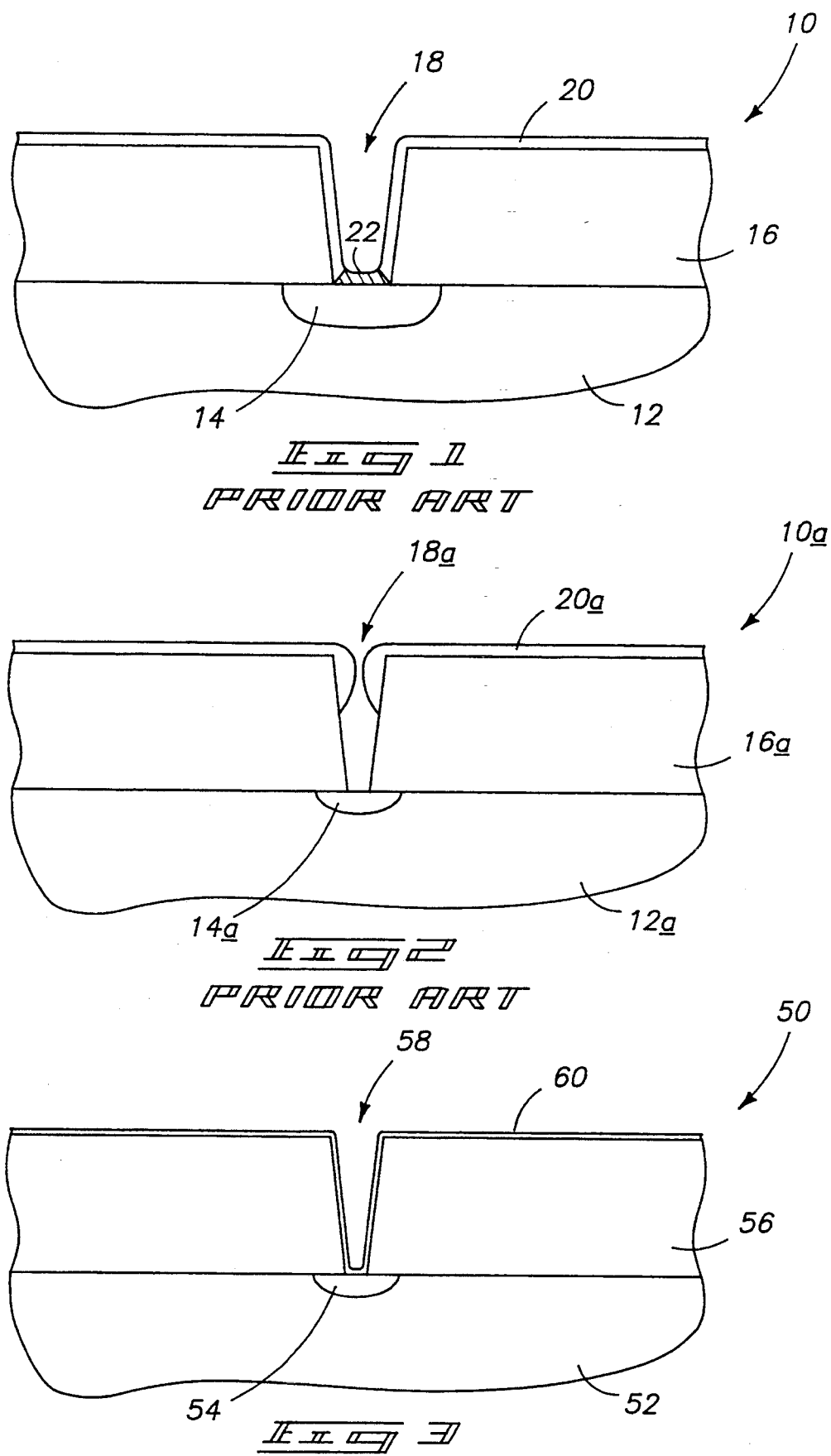

CHEMICAL VAPOR DEPOSITION TECHNIQUE FOR DEPOSITING TITANIUM SILICIDE ON SEMICONDUCTOR WAFERS

RELATED PATENT DATA

This patent resulted from a continuation-in-part application of U.S. patent application Ser. No. 07/926,754, field Aug. 7, 1992, now U.S. Pat. No. 5,240,730.

TECHNICAL FIELD

This invention relates generally to contact technology in semiconductor wafer processing, and more particularly to the providing of silicide layers within contact openings for reducing contact resistance.

BACKGROUND OF THE INVENTION

In the processing of integrated circuits, electrical contact must be made to isolated active-device regions formed within a wafer/substrate. The active-device regions are connected by high electrically conductive paths or lines which are fabricated above an insulator material, which covers the substrate surface. To provide electrical connection between the conductive path and active-device regions, an opening in the insulator is provided to enable the conductive film to contact the desired regions. Such openings are typically referred to as contact openings, or simply "contacts".

As transistor active area dimensions approached one micron in diameter, conventional process parameters resulted in intolerable increased resistance between the active region or area and the conductive layer. A principal way of reducing such contact resistance is by formation of a metal silicide atop the active area prior to application of the conductive film for formation of the conductive runner. One common metal silicide material formed is $TiSi_x$, where x is predominately "2". The $TiSi_x$ material is typically provided by first applying a thin layer of titanium atop the wafer which contacts the active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts the silicon active regions. The applied titanium film everywhere else overlies an insulative, and substantially non-reactive $SiO_2$ layer.

Such is illustrated in FIG. 1. Shown is a semiconductor wafer 10 comprised of a bulk substrate 12 having an active area 14 formed therein. An overlying layer 16 of insulating material, predominately $SiO_2$ in the form of BPSG, has been provided atop substrate 12 and appropriately etched to form a contact opening 18 to active area 14. A thin layer 20 of titanium is applied over insulating layer 16 and contacts active area 14. The high temperature anneal step is conducted in an inert environment, such as argon, to react titanium metal contacting active region 14 into $TiSi_x$, thereby forming the illustrated $TiSi_x$ region 22. The remaining portion of layer 20 not contacting region 14 is substantially nonreactive with its underlying insulating $SiO_2$ layer 16, and thereby remains as elemental titanium metal.

A contact filling material, such as tungsten, is typically applied atop silicide region 22. Tungsten adheres poorly to $TiSi_x$. To overcome this problem, an intervening layer typically of TiN is interposed between silicide region 22 and an overlying tungsten layer. TiN is commonly referred to as a "glue layer" for the metal tungsten layer. Such can be provided by annealing wafer 10 with titanium layer 20 in an atmosphere which is predominately nitrogen. Under such conditions, the lower portion of layer 20 overlying active region 14 will react with the silicon to form the $TiSi_x$, while the upper portion of layer 20 of the titanium over contact area 14 and the remaining portion of layer 20 over insulating material 16 reacts with the nitrogen of the atmosphere to form TiN.

From this point, the predominate conductive material of the runner to be formed is applied. The silicide region 22 which is formed is highly conductive, and provides less electrical resistance between the runner and active area 14 than were silicide region 22 not present. Formation of such silicides, and titanium silicide in particular, are described in Wolf, et al., "Silicon Processing For The VLSI Era. Vol. 2—Process Integration," pages 143–150.

As device dimensions continue to shrink and the contact openings become deeper and narrower, contact walls become vertical and most of the metal deposition techniques fail to provide the necessary step coverage to create adequate contact with the active area 14. Such is illustrated in FIG. 2. There, active area 14a of substrate 12a is shown significantly smaller than active area 14 in FIG. 1. Correspondingly, a significantly narrower contact opening 18a is provided to active area 14, thereby maximizing circuit density. As is apparent, the ratio of the depth of contact opening 18a relative to its width is greater than the ratio of the depth to the width of contact opening 18 in FIG. 1. Such narrow, high aspect ratio contact openings 18a can result in layer 20a failing to make significant contact with region 14a, as shown. Accordingly, the desired $TiSi_x$ and electrical contact are not formed, $TiSi_x$ can be deposited directly as opposed to a result of substrate reaction with elemental titanium. One way is by low pressure chemical vapor deposition using titanium tetrachloride and silane according to the following formula:

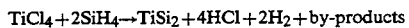

$$TiCl_4 + 2SiH_4 \rightarrow TiSi_2 + 4HCl + 2H_2 + \text{by-products}$$

Low pressure chemical vapor deposition provides a distinct advantage of excellent conformality adequate to achieve desired coverage in high aspect ratio vias or contacts. However, one significant problem associated with the above reaction is that it is conducted at temperatures above 700° C. to effect the desired reaction. Most commercially available chemical vapor deposition reactors are comprised of aluminum, which has a melting temperature of around 600° C. Accordingly, alternate material and accordingly more expensive chemical vapor deposition chambers would need to be developed for the above reaction to prevent reactor meltdown.

Another drawback associated with high temperature deposition of titanium silicide films relates to a competing reaction of the $TiCl_4$ with silicon of the substrate. Such a reaction would compete with the low pressure chemical vapor deposition reaction, resulting in undesirable or uncontrollable consumption of silicon from the substrate.

Another prior art process of providing a titanium silicide film is disclosed in U.S. Pat. No. 4,568,565. Such discloses use of titanium halides and hydrosilicides, also referred to as silanes. However, the process requires the use of high intensity light. Such has the drawback of increasing process complexity, and causes the processor to contend with attempting to achieve light uniformity throughout the reactor. Such is not an easy task. Further, step coverage especially within high aspect ratio openings can be poor in light energy CVD processes as sidewalls within such openings do not get full exposure to light Efficiency is also problematical, as is for example evident from col. 7, lns. 19-28 of such patent.

It would be desirable to overcome these drawbacks.

BRIEF DESCRIPTION OF THE DRAWINGS

Preferred embodiments of the invention are described below with reference to the following accompanying drawings.

FIG. 1 is a diagrammatic cross sectional view of a prior art wafer, and is discussed in the "Background" section above.

FIG. 2 is a diagrammatic cross sectional view of an alternate prior art wafer, and is discussed in the "Background" section above.

FIG. 3 is a diagrammatic cross sectional view of a semiconductor wafer processed in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with the invention, disclosed is a chemical vapor deposition (CVD) method of providing a conformal layer of titanium silicide atop a semiconductor wafer within a chemical vapor deposition reactor. The method comprises, a) positioning a wafer within the CVD reactor; b) injecting selected quantities of a gaseous titanium halide, or alternately or in addition thereto a gaseous titanium organometallic precursor, a gaseous compound of the formula $Si_nH_{2n+2}$ where "n" is an integer greater than or equal to 2, and a carrier gas to within the reactor; and c) maintaining the reactor at a selected pressure and a selected temperature which are effective for reacting the titanium halide and $Si_nH_{2n+2}$ to deposit a film on the wafer, the film comprising a titanium silicide, the method being void of use of high intensity light during processing. Carrier and/or dilution gases might also of course be utilized in the process.

Such a process can be conducted with an energy source provided to the reactor which consists essentially of thermal energy. Alternately, another or added energy source, such as RF or plasma, might be utilized.

The preferred titanium halide is $TiCl_4$. Others include titanium tetraboride, titanium tetrafluoride, titanium tetraiodide, and subhalides. A preferred titanium organometallic precursor comprises a compound of the formula $Ti(NR_2)_4$, where R comprises a carbon containing radical An example is tetradimethylamido titanium (TDMAT). Such is typically injected into a reactor by bubbling an inert gas, such as He, through TDMAT liquid which vaporizes the TDMAT which is then directed the reactor. Other techniques for injecting TDMAT gas into reactor would include atomizing the TDMAT liquid and injecting such liquid into the reactor which would essentially instantly vaporize into TDMAT gas. Another technique for injecting TDMAT gas into the reactor would be to provide TDMAT in a solid form in the reactor, with the solid form subliming and thereby injecting TDMAT gas into the reactor. Such techniques for providing TDMAT to a reactor are known to people of skill in the art. Alternate examples of organic titanium precursors include tetradiethylamido titanium, bis-cyclopentadienyl titanium diazide and tris-2,2'bipyridine titanium.

Where n=2, the selected temperature for effectively depositing the desired layer is expected to be as low as about 400° C. Under such circumstances, the selected temperature is preferably from about 400° C. to about 800° C. Most preferred is a temperature from about 400° C. to about 650° C. to overcome problems associated with high deposition temperatures, such as described in the "Background" section of this document.

Where n=3, the selected temperature for effectively depositing the desired layer is expected to be as low as about 300° C. Under such circumstances, the selected temperature is preferably from about 300° C. to about 800° C. Most preferred is a temperature from about 300° C. to about 650° C. to overcome problems associated with high deposition temperatures, such as described in the "Background" section of this document.

The preferred selected pressure for operation would be a low chemical vapor deposition pressure of less than or equal to about 100 Torr, with a selected pressure of from about 0.5 Torr to about 30 Torr being most preferred.

A wide range of volumetric ratios of titanium halide and/or titanium organometallic precursor to $Si_nH_{2n+2}$ are expected to be usable, such as from 1:100 to 100:1. The preferred volumetric ratio of is expected to be from about 1:10 to about 10:1. A mixture of gaseous compounds of the formula $Si_nH_{2n+2}$ could also be utilized, such as combinations of $Si_2H_6$ and $Si_3H_8$. A flow of carrier gases is also provided to control the gas distribution above the wafer surface to obtain good uniformity of the film deposited across the wafer. The preferred carrier gas is a noble gas, such as helium or argon.

Example flow rates for a six liter chemical vapor deposition reactor would include from about 1 to 30 sccm of titanium halide and/or titanium organometallic precursor, with about 15 sccm being most preferred, and from about 1-500 standard cubic centimeters per minute (sccm) of the $Si_nH_{2n+2}$ compound(s), with about 25 sccm being most preferred. The preferred flow rate of the carrier gas would be from about 100 sccm to about 2000 sccm. The most preferred flow rate is believed to be about 500 sccm. Deposition rate of the film under such conditions is expected to be 500 Angstroms per minute.

Under the above-described conditions, it is expected that the deposited film will comprise a combination of titanium silicides, such as of the formula TiSi, $TiSi_2$, and $Ti_5Si_3$, with the quantity of $TiSi_2$ predominating. Exemplary reactions are presented as follows:

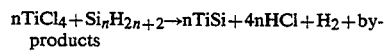

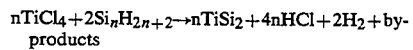

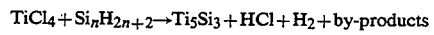

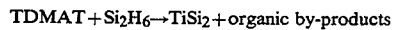

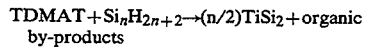

Example by-products are expected to be $SiH_3Cl$, $SiCl$ and $SiH_2Cl_2$. Example organic by-products are expected to be $(CH_3)_2NH_2$, $CH_3NH_2$ and $CH_4$.

The invention was reduced to practice using flow rates of $TiCl_4$, $Si_2H_6$, and Ar of 5 sccm, 10 sccm and 400 sccm, respectively. Pressure was maintained at 20 Torr, and temperature maintained at 530° C. Process time was 100 seconds. Bulk resistance of the deposited film was determined to be 20 micro-ohms cm. No laser light was utilized during processing, and accordingly no additional light "absorbing gas" is required or utilized, such as is disclosed in U.S. Pat. No. 4,568,565, col. 7, lns. 23-28. Accordingly, the invention overcomes the problems associated in the prior art with respect to high intensity light application and with respect to high temperatures.

FIG. 3 illustrates a wafer 50 processed in accordance with the invention. Wafer 50 includes a bulk substrate 52 having an active area 54 formed therein. An insulating layer 56, predominately BPSG, has been provided and etched to form a contact opening 58. By the above-described technique, a layer 60 of titanium silicide is conformally provided and makes excellent contact with region 54.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A chemical vapor deposition method of providing a conformal layer of titanium silicide atop a semiconductor wafer within a chemical vapor deposition reactor, the method comprising the following steps:
   positioning a wafer within the reactor;
   injecting selected quantities of a gaseous titanium halide, a gaseous compound of the formula $Si_nH_{2n+2}$ where "n" is an integer greater than or equal to 2, and a carrier gas to within the reactor; and
   maintaining the reactor at a selected pressure and a selected temperature which are effective for reacting the titanium halide and $Si_nH_{2n+2}$ to deposit a film on the wafer, the film comprising a titanium silicide, the method being void of use of reaction inducing high intensity light during processing.

2. The chemical vapor deposition method of claim 1 wherein the titanium halide is $TiCl_4$.

3. The chemical vapor deposition method of claim 1 further comprising providing an energy source to the reactor for maintaining the temperature, the energy consisting essentially of thermal energy.

4. The chemical vapor deposition method of claim 1 wherein n=2, and the selected temperature is from about 400° C. to about 650° C.

5. The chemical vapor deposition method of claim 1 wherein n=3, and the selected temperature is from about 300° C. to about 650° C.

6. The chemical vapor deposition method of claim 1 wherein the selected pressure is from about 0.5 Torr to about 30 Torr.

7. The chemical vapor deposition method of claim 1 wherein n=2, the selected temperature is from about 400° C. to about 650° C., and the selected pressure is from about 0.5 Torr to about 30 Torr.

8. The chemical vapor deposition method of claim 1 wherein n=3, the selected temperature is from about 300° C. to about 650° C., and the selected pressure is from about 0.5 Torr to about 30 Torr.

9. The chemical vapor deposition method of claim 1 wherein the titanium silicide of the film is predominately $TiSi_2$.

10. A chemical vapor deposition method of providing a conformal layer of titanium silicide atop a semiconductor wafer within a chemical vapor deposition reactor, the method comprising the following steps:
    positioning a wafer within the reactor;
    injecting selected quantities of a gaseous titanium organometallic precursor, a gaseous compound of the formula $Si_nH_{2n+2}$ where "n" is an integer greater than or equal to 2, and a carrier gas to within the reactor; and
    maintaining the reactor at a selected pressure and a selected temperature which are effective for reacting the titanium organometallic precursor and $Si_nH_{2n+2}$ to deposit a film on the wafer, the film comprising a titanium silicide, the method being void of use of reaction inducing high intensity light during processing.

11. The chemical vapor deposition method of claim 10 wherein the titanium organometallic precursor is selected from the group consisting of a compound of the formula $Ti(NR_2)_4$, where R comprises a carbon containing radical and bis-cyclopentadienyl titanium diazide, or mixtures thereof.

12. The chemical vapor deposition method of claim 10 further comprising providing an energy source to the reactor for maintaining the temperature, the energy consisting essentially of thermal energy.

13. The chemical vapor deposition method of claim 10 wherein n=2, and the selected temperature is from about 400° C. to about 650° C.

14. The chemical vapor deposition method of claim 10 wherein n=3, and the selected temperature is from about 300° C. to about 650° C.

15. The chemical vapor deposition method of claim 10 wherein the selected pressure is from about 0.5 Torr to about 30 Torr.

16. The chemical vapor deposition method of claim 10 wherein n=2, the selected temperature is from about 400° C. to about 650° C., and the selected pressure is from about 0.5 Torr to about 30 Torr.

17. The chemical vapor deposition method of claim 10 wherein n=3, the selected temperature is from about 300° C. to about 650° C., and the selected pressure is from about 0.5 Torr to about 30 Torr.

18. The chemical vapor deposition method of claim 10 wherein the titanium silicide of the film is predominately $TiSi_2$.

19. A chemical vapor deposition method of providing a conformal layer of titanium silicide atop a semiconductor wafer within a chemical vapor deposition reactor, the method comprising the following steps:
    positioning a wafer within the reactor;
    injecting selected quantities of a gaseous titanium halide, a gaseous compound of the formula $Si_nH_{2n+2}$ where "n" is 2 or 3, and a carrier gas to within the reactor; and maintaining the reactor at a pressure of less than or equal to about 100 Torr and at temperature from about 300° C. to about 800° C. which are effective for reacting the titanium halide and $Si_nH_{2n+2}$ to deposit a film on the wafer, the film comprising titanium silicides of the formulas $TiSi$, $TiSi_2$ and $Ti_5Si_3$, the method being void of use of reaction inducing high intensity light during processing.

20. A chemical vapor deposition method of providing a conformal layer of titanium silicide atop a semiconductor wafer within a chemical vapor deposition reactor, the method comprising the following steps:

positioning a wafer within the reactor;

injecting selected quantities of a gaseous titanium organometallic precursor, a gaseous compound of the formula $Si_nH_{2n+2}$ where "n" is 2 or 3, and a carrier gas to within the reactor; and maintaining the reactor at a pressure of less than or equal to about 100 Torr and at temperature from about 300° C. to about 800° C. which are effective for reacting the titanium organometallic precursor and $Si_nH_{2n+2}$ to deposit a film on the wafer, the film comprising titanium silicides of the formulas $TiSi$, $TiSi_2$ and $Ti_5Si_3$, the method being void of use of reaction inducing high intensity light during processing.

* * * * *

(12) EX PARTE REEXAMINATION CERTIFICATE (4892nd)
United States Patent
Doan et al.

(10) Number: US 5,376,405 C1
(45) Certificate Issued: *Jan. 13, 2004

(54) CHEMICAL VAPOR DEPOSITION TECHNIQUE FOR DEPOSITING TITANIUM SILICIDE ON SEMICONDUCTOR WAFERS

(75) Inventors: Trung T. Doan, Bosie, ID (US); Gurteji S. Sandhu, Bosie, ID (US)

(73) Assignee: Micron Technology, Inc., Boise, ID (US)

Reexamination Request:
No. 90/005,780, Jul. 31, 2000

Reexamination Certificate for:
Patent No.: 5,376,405
Issued: Dec. 27, 1994
Appl. No.: 08/048,655
Filed: Apr. 15, 1993

(*) Notice: This patent is subject to a terminal disclaimer.

Related U.S. Application Data

(63) Continuation-in-part of application No. 07/926,754, filed on Aug. 7, 1992, now Pat. No. 5,240,739.

(51) Int. Cl.[7] .............................. C23C 16/42; B05D 3/08
(52) U.S. Cl. ........................ 438/680; 438/683; 438/649; 438/655; 427/126.1; 427/255.391; 427/255.393; 427/255.17; 427/294; 257/E21.165; 257/E21.296; 257/E21.582
(58) Field of Search ..................... 427/126.1, 255.391, 427/255.393, 255.17, 294; 438/680, 683, 649, 655

(56) References Cited

U.S. PATENT DOCUMENTS

| | | | |
|---|---|---|---|
| 2,898,235 A | | 8/1959 | Bulloff |
| 4,766,006 A | | 8/1988 | Gaczi |
| 4,902,645 A | * | 2/1990 | Ohba |
| 4,957,777 A | | 9/1990 | Ilderem et al. |
| 5,080,927 A | | 1/1992 | Ikeda et al. |
| 5,104,694 A | | 4/1992 | Saito et al. |

FOREIGN PATENT DOCUMENTS

| | | |
|---|---|---|
| DE | 4013143 A1 | 10/1990 |
| DE | 4122473 A1 | 1/1992 |
| EP | 0406995 A1 | 7/1990 |

* cited by examiner

Primary Examiner—Timothy H. Meeks

(57) ABSTRACT

Disclosed is a chemical vapor deposition (CVD) method of providing a conformal layer of titanium silicide atop a semiconductor wafer within a chemical vapor deposition reactor. Such includes, a) positioning a wafer within the CVD reactor; b) injecting selected quantities of a gaseous titanium halide, or alternately or in addition thereto a gaseous titanium organometallic precursor, a gaseous compound of the formula $Si_nH_{2n+2}$ where "n" is an integer greater than or equal to 2, and a carrier gas to within the reactor; and c) maintaining the reactor at a selected pressure and a selected temperature which are effective for reacting the titanium halide and $Si_nH_{2n+2}$ to deposit a film on the wafer, the film comprising a titanium silicide, the method being void of use of high intensity light during processing.

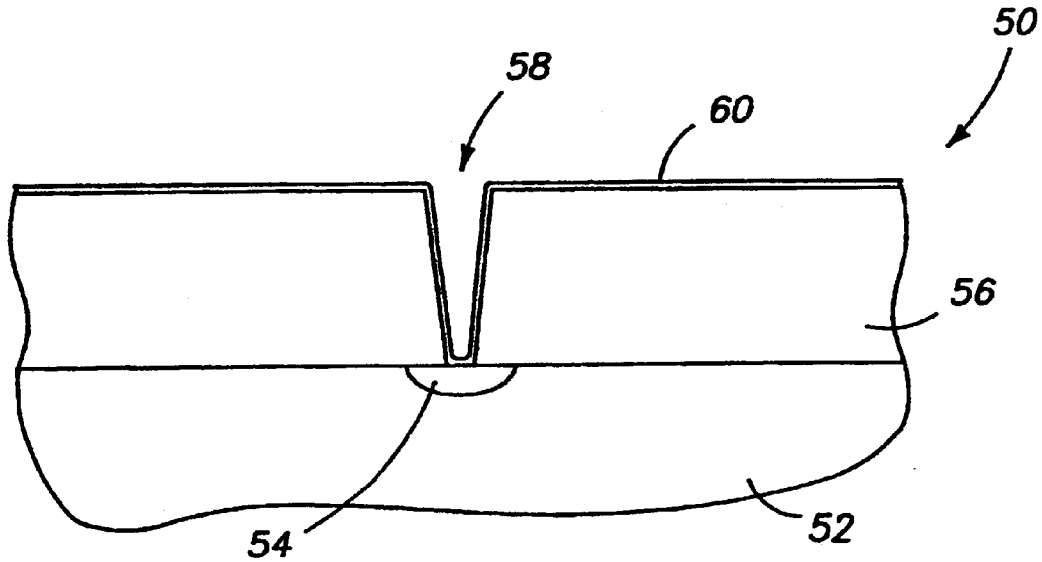

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been delected and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 3, line 54–Column 4, line 7:

The preferred titanium halide is $TiCl_4$. Others include titanium [tetraboride] *tetrabromide*, titanium tetrafluoride, titanium tetraiodide, and subhalides. A preferred titanium organometallic precursor comprises a compound of the formula $Ti(NR_2)_4$, where R comprises a carbon containing radical An example is tetradimethylamido titanium (TDMAT). Such is typically injected into a reactor by bubbling an inert gas, such as He, through TDMAT liquid which vaporizes the TDMAT which is then directed the reactor. Other techniques for injecting TDMAT gas into reactor would include atomizing the TDMAT liquid and injecting such liquid into the reactor which would essentially instantly vaporize into TDMAT gas. Another technique for injecting TDMAT gas into the reactor would be to provide TDMAT in a solid form in the reactor, with the solid form subliming and thereby injecting TDMAT gas into the reactor. Such techniques for providing TDMAT to a reactor are known to people of skill in the art. Alternate examples of organic titanium precurors include tetradiethylamido titanium, bis-cyclopentadienyl titanium diazide and tris-2, 2'bipyridine titanium.

AS A RESULT OF REEXAMINATION, IT HAS BEEN DETERMINED THAT:

The patentability of claims 10, 12–18 and 20 is confirmed.

Claims 1–9 and 19 are cancelled.

Claim 11 is determined to be patentable as amended.

New claim 21 is added and determined to be patentable.

11. The chemical vapor deposition method of claim 10 wherein the titanium organometallic precursor is selected from the group consisting of a compound of the formula $Ti(NR_2)_4$, where R comprises a carbon containing radical, [and] bis-cyclopentadienyl titanium diazide, [or] *and* mixtures thereof.

*21. A chemical vapor deposition method of providing a conformal layer of titanium silicide atop a semiconductor wafer within a chemical vapor deposition reactor, the method comprising the following steps:*

*positioning a wafer within a reactor;*

*injecting selected quantities of a gaseous titanium organometallic precursor, a gaseous compound of the formula $Si_nH_{2n+2}$ where "n" is 2 or 3, and a carrier gas to within the reactor; wherein the gaseous titanium organometallic precursor is selected from the group consisting of a compound of the formula $Ti(NR_2)_4$, wherein R comprises a carbon containing radical, bis-cyclopentadienyl titanium diazide, and mixtures thereof and*

*maintaining the reactor at a pressure of less than or equal to about 100 Torr and at a temperature from about 300° C. to about 800° C. which are effective for reacting the titanium organometallic precursor and $Si_2H_{2n+2}$ to deposit a film on the wafer, the film comprising titanium silicides of the formulas $TiSi$, $TiSi_2$, and $Ti_5Si_3$, the method being void of use of reaction inducing high intensity light during processing.*

\* \* \* \* \*